(12) United States Patent
Hsu et al.

(10) Patent No.: US 10,730,744 B2
(45) Date of Patent: Aug. 4, 2020

(54) MEMS DEVICE WITH MOVABLE STAGE

(71) Applicant: INDUSTRIAL TECHNOLOGY RESEARCH INSTITUTE, Hsinchu (TW)

(72) Inventors: Yu-Wen Hsu, Tainan (TW); Che-Kai Yeh, Tainan (TW); Chin-Fu Kuo, Tainan (TW); Chao-Ta Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/235,054

(22) Filed: Dec. 28, 2018

(65) Prior Publication Data
US 2020/0212826 A1    Jul. 2, 2020

(51) Int. Cl.
*B81B 3/00*     (2006.01)
*B81B 7/00*     (2006.01)
(Continued)

(52) U.S. Cl.
CPC .......... *B81B 7/0064* (2013.01); *B81B 3/0051* (2013.01); *B81B 7/007* (2013.01);
(Continued)

(58) Field of Classification Search
CPC .... B81B 2203/0145; B81B 2203/0163; B81B 2203/0172; B81B 3/00; B81B 2201/02;
(Continued)

(56) References Cited

U.S. PATENT DOCUMENTS 6,549,107 B2    4/2003    Lim et al.
6,809,851 B1    10/2004   Gurcan
(Continued)

FOREIGN PATENT DOCUMENTS

CN    107359057 A    11/2017
TW    200944466 A1   11/2009
(Continued)

OTHER PUBLICATIONS

Xi et al. "A MEMS XY-stage with sub-nanometer positioning resolution" Proeedings of 2015 IEEE International Conference on Mechatronics and Automation; Aug. 2-5, 2015.
(Continued)

*Primary Examiner* — Burton S Mullins
(74) *Attorney, Agent, or Firm* — Maschoff Brennan (57) ABSTRACT

A MEMS device includes a substrate, at least one anchor disposed on the substrate, a movable stage, a sensing chip disposed on the movable stage, and at least one elastic member connected with the movable stage and the anchor. The movable stage includes at least one electrode and at least one conductive connecting layer. The sensing chip includes at least one electrical interconnection connected with the conductive connecting layer. The elastic member includes at least one first electrical channel, a second electrical channel and an electrical insulation layer disposed between the first electrical channel and the second electrical channel. The first electrical channel is electrically connected with the electrical interconnection, and the second electrical channel is electrically connected with the electrode.

16 Claims, 10 Drawing Sheets

(51) Int. Cl.
*H02N 1/00* (2006.01)
*H04N 5/232* (2006.01)

(52) U.S. Cl.
CPC ........ *H02N 1/008* (2013.01); *B81B 2201/033* (2013.01); *B81B 2203/0307* (2013.01); *B81B 2203/04* (2013.01); *H04N 5/23287* (2013.01)

(58) Field of Classification Search
CPC ........ B81B 2201/0292; B81B 2201/04; B81B 2201/042; B81B 2201/045; B81B 2201/047; B81B 2203/051; B81B 2207/07; B81B 7/0006; B81B 3/0051; H01H 1/00; H04N 5/2253; H02N 1/008
USPC ........................................... 310/309; 267/154
See application file for complete search history.

(56) References Cited

U.S. PATENT DOCUMENTS

| | | |
|---|---|---|
| 6,912,082 B1 | 6/2005 | Lu et al. |
| 6,924,581 B2* | 8/2005 | Greywall .............. B81B 3/0051 310/309 |
| 6,978,656 B2 | 12/2005 | Blakley |
| 7,203,111 B2 | 4/2007 | Martin et al. |
| 8,248,497 B2* | 8/2012 | Tanimura ............. H04N 5/2253 348/208.4 |
| 8,553,342 B2 | 10/2013 | Lee et al. |
| 8,695,426 B2* | 4/2014 | Hsu ....................... B81B 3/0086 73/504.12 |
| 8,855,476 B2 | 10/2014 | Liu et al. |
| 8,878,981 B2 | 11/2014 | Lee |
| 8,970,781 B2 | 3/2015 | Ryou |
| 9,019,390 B2 | 4/2015 | Gutierrez et al. |
| 9,051,170 B2* | 6/2015 | Huang ............... G01R 33/0286 |
| 9,094,027 B2 | 7/2015 | Tao et al. |
| 9,227,840 B2* | 1/2016 | Su .......................... B81B 7/008 |
| 9,426,362 B2 | 9/2016 | Tang et al. |
| 9,563,067 B2 | 2/2017 | Kim et al. |
| 9,729,038 B2* | 8/2017 | Takimoto ........... G02B 26/0816 |
| 2002/0118084 A1 | 8/2002 | Lim et al. |
| 2004/0065933 A1* | 4/2004 | Foong .................. H01L 21/563 257/433 |
| 2006/0268383 A1* | 11/2006 | Cho .................... G02B 26/0841 359/225.1 |
| 2006/0284514 A1* | 12/2006 | Ko ..................... G02B 26/0841 310/309 |
| 2009/0309521 A1 | 12/2009 | Yee et al. |
| 2011/0181955 A1 | 7/2011 | Cho et al. |
| 2013/0057757 A1 | 3/2013 | Ryou |
| 2013/0076919 A1 | 3/2013 | Gutierrez et al. |
| 2013/0077945 A1 | 3/2013 | Liu et al. |
| 2013/0271228 A1 | 10/2013 | Tao et al. |
| 2015/0085363 A1 | 3/2015 | Liu et al. |
| 2015/0103190 A1 | 4/2015 | Corcoran et al. |
| 2015/0131000 A1 | 5/2015 | Ryou |
| 2015/0219875 A1 | 9/2015 | Bansal et al. |
| 2015/0334277 A1 | 11/2015 | Liu et al. |
| 2015/0341534 A1 | 11/2015 | Ng et al. |
| 2016/0137491 A1 | 5/2016 | Su et al. |
| 2016/0165103 A1 | 6/2016 | Topliss |
| 2016/0190958 A1 | 6/2016 | Gutierrez et al. |
| 2016/0212332 A1 | 7/2016 | Tang et al. |

FOREIGN PATENT DOCUMENTS

| | | |
|---|---|---|
| TW | 201331117 A | 8/2013 |
| TW | 201617618 A | 5/2016 |

OTHER PUBLICATIONS

Rudraswamy et al. "MEMS based Optical Image Stabilization" International Conference on "Emerging Research in Electronics, Computer Science and Technology (ICERECT-2015)"; Dec. 2015.
Gokce et al. "Two-Dimensional MEMS Stage Integrated With Microlens Arrays for Laser Beam Steering" Journal of Microelectromechanical Systems, vol. 20, No. 1, Feb. 2011.
TW Office Action in Application No. 107147666 dated Mar. 31, 2020.

\* cited by examiner

MEMS DEVICE WITH MOVABLE STAGE

BACKGROUND

1. Technical Field

This present disclosure relates to a MEMS (Microelectromechanical system) device with a movable stage.

2. Related Art

Devices based on MEMS technology have the advantages of being compact, lightweight, cost-effective and so on. The MEMS devices have increasing demand and wide applications in many fields.

At present, in the field of photography, image stabilization has been developed in order to solve the problem of blurred images caused by camera shake. Devices for image stabilization include an optical image stabilizer (OIS) and an electronic image stabilizer (EIS). Some image stabilizers use a MEMS stage, working with an image sensor, to compensate for the displacement shift of the camera by controlling the movement of the MEMS stage, thereby obtaining proper image sharpness.

SUMMARY

According to one aspect of the present disclosure, a MEMS device with movable stage includes a substrate, at least one anchor disposed on the substrate, a stage, a sensing chip disposed on the stage, and at least one elastic member connected with the stage and the anchor. The stage includes at least one electrode and at least one conductive connecting layer. The sensing chip includes at least one electrical interconnection connected with the conductive connecting layer of the stage. The elastic member includes at least one first electrical channel, a second electrical channel and an electrical insulation layer. The first electrical channel is configured to transmit a first electrical signal generated by the sensing chip. The electrical insulation layer is disposed between the first electrical channel and the second electrical channel. The first electrical channel is electrically connected with the electrical interconnection, and the second electrical channel is electrically connected with the electrode on the stage.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
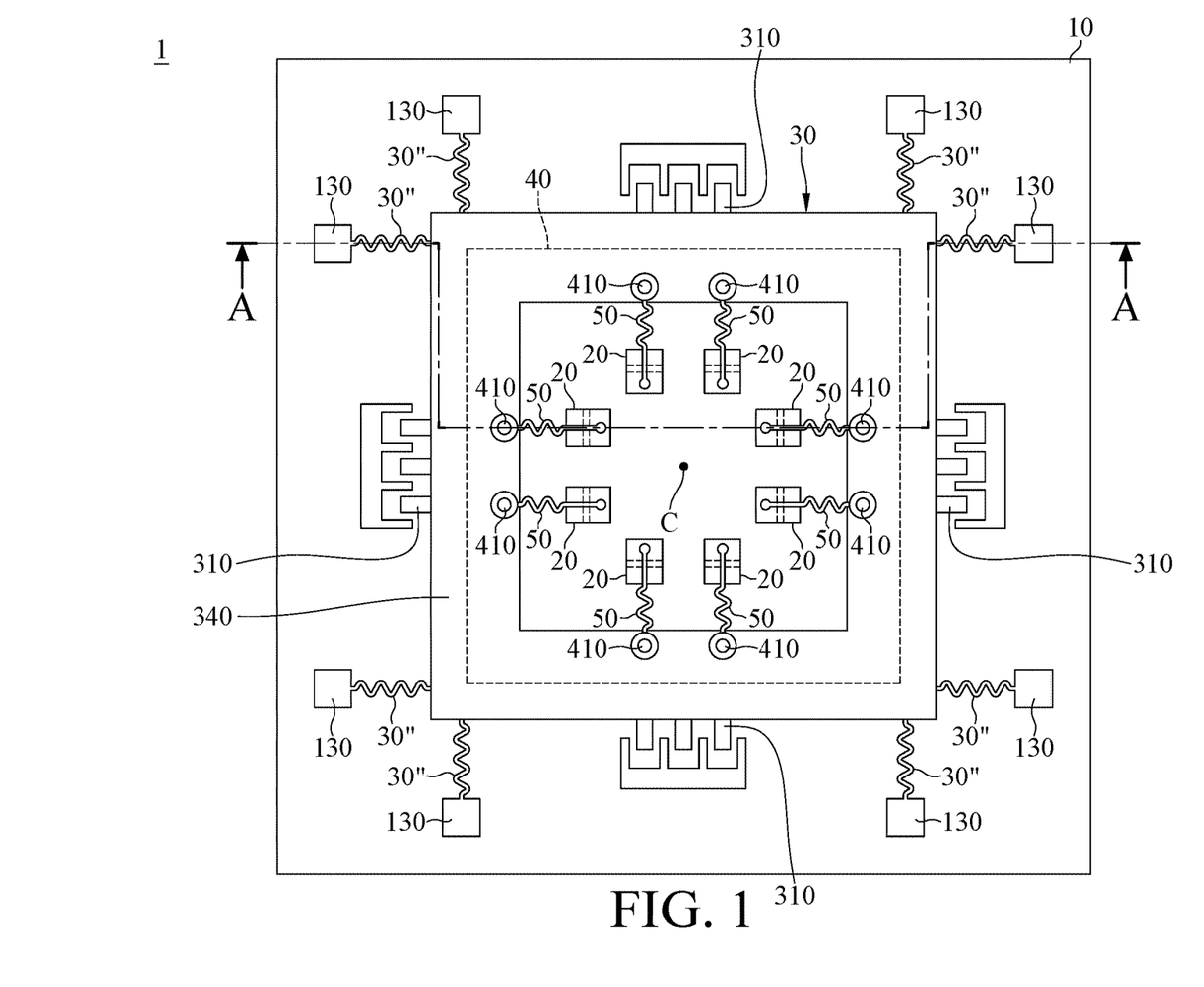
FIG. 1 is a top view of a MEMS device with a movable stage according to a first embodiment of the present disclosure.
Figure 2:
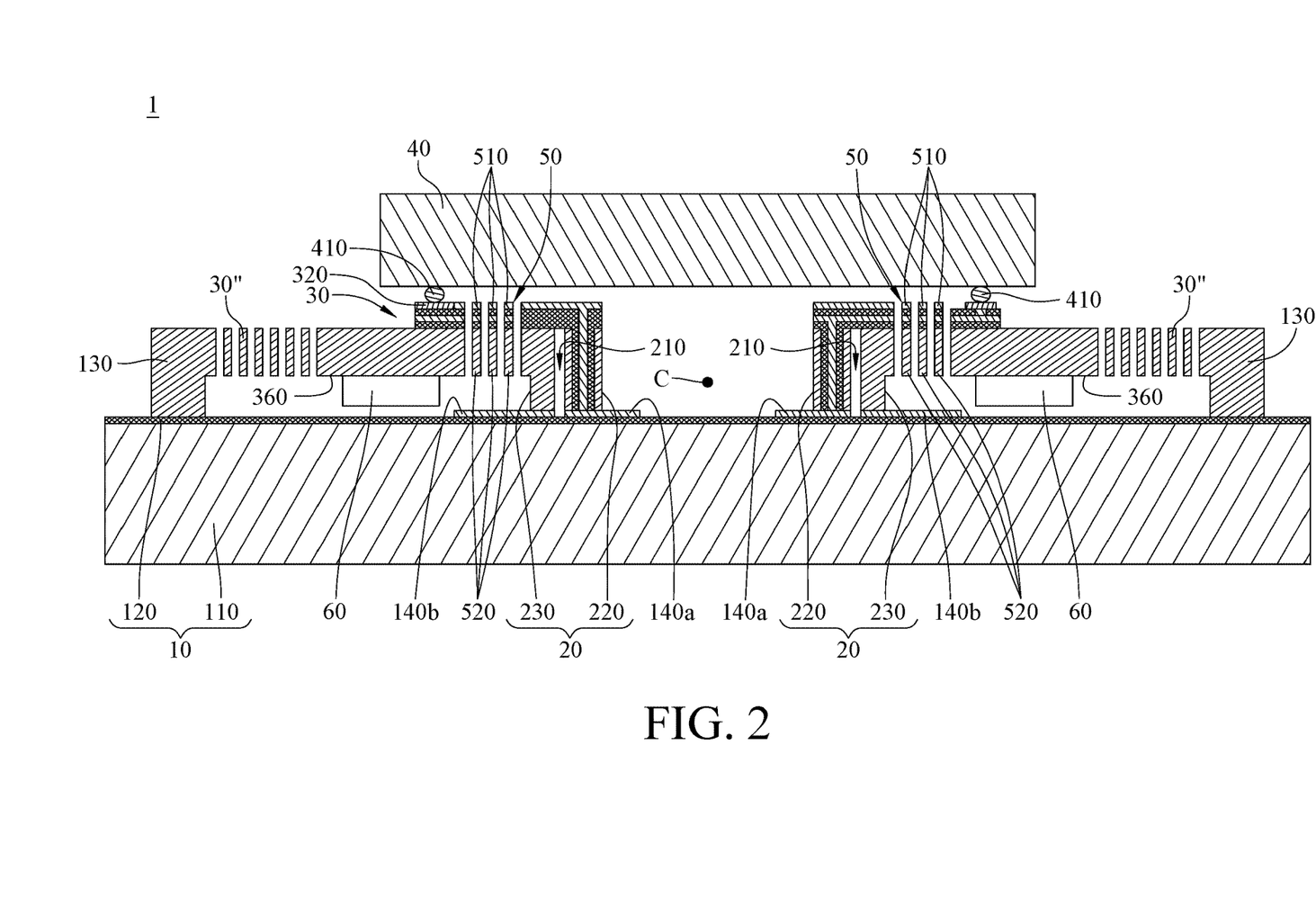
FIG. 2 is a cross-sectional view of the MEMS device in FIG. 1 along line A-A.

According to one embodiment of the present disclosure, a MEMS device includes a substrate, at least one anchor, a stage, a sensing chip, and at least one elastic member. Please refer to FIG. 1 and FIG. 2. FIG. 1 is a top view of a MEMS device with a movable stage according to a first embodiment of the present disclosure. FIG. 2 is a cross-sectional view of the MEMS device in FIG. 1 along line A-A. In this embodiment, a MEMS device 1 includes a substrate 10, multiple anchors 20, a stage 30, a sensing chip 40 and a plurality of elastic members 50. It is worth noting that the protective scope of the present disclosure is not limited to the number of anchors 20 and the number of elastic members 50. For the purpose of illustration, the sensing chip 40 in FIG. 1 is represented by dashed line, and elements covered by the sensing chip 40 in FIG. 1 are represented by a solid line.

The substrate 10 includes a main portion 110, an insulating film 120 and a plurality of conductive layers 140a and 140b. The insulating film 120 is disposed on a surface of the main portion 110. A plurality of bases 130 are disposed on the substrate 10, and the conductive layers 140a and 140b are disposed on a surface of the insulating film 120. The main portion 110, for example, is a printed circuit board or a glass substrate. The anchors 20 are disposed on the conductive layers 140a and 140b of the substrate 10.

The stage 30 is connected with the bases 130 disposed on the substrate 10 by a plurality of elastic members 30″, and the stage 30 is movable and is suspended above the substrate 10. The stage 30 includes a plurality of electrodes 310 and a plurality of conductive connecting layers 320. The electrode 310, for example, is a comb electrode configured to generate an electrostatic force to control the movement of the stage 30. It is worth noting that the protective scope of the present disclosure is not limited to the number of electrodes 310 and conductive connecting layers 320.

The sensing chip 40 is disposed on the stage 30, and the sensing chip 40 includes a plurality of electrical interconnections 410 connected with the conductive connecting layers 320 of the stage 30. Therefore, when the stage 30 is moving, there is no relative movement between the electrical interconnections 410 and the stage 30 so as to prevent fracture of the electrical interconnection 410 due to pulling force and pushing force repeatedly applied on the electrical interconnection 410. It is worth noting that the protective scope of the present disclosure is not limited to the number of electrical interconnections 410.

Figure 3A:
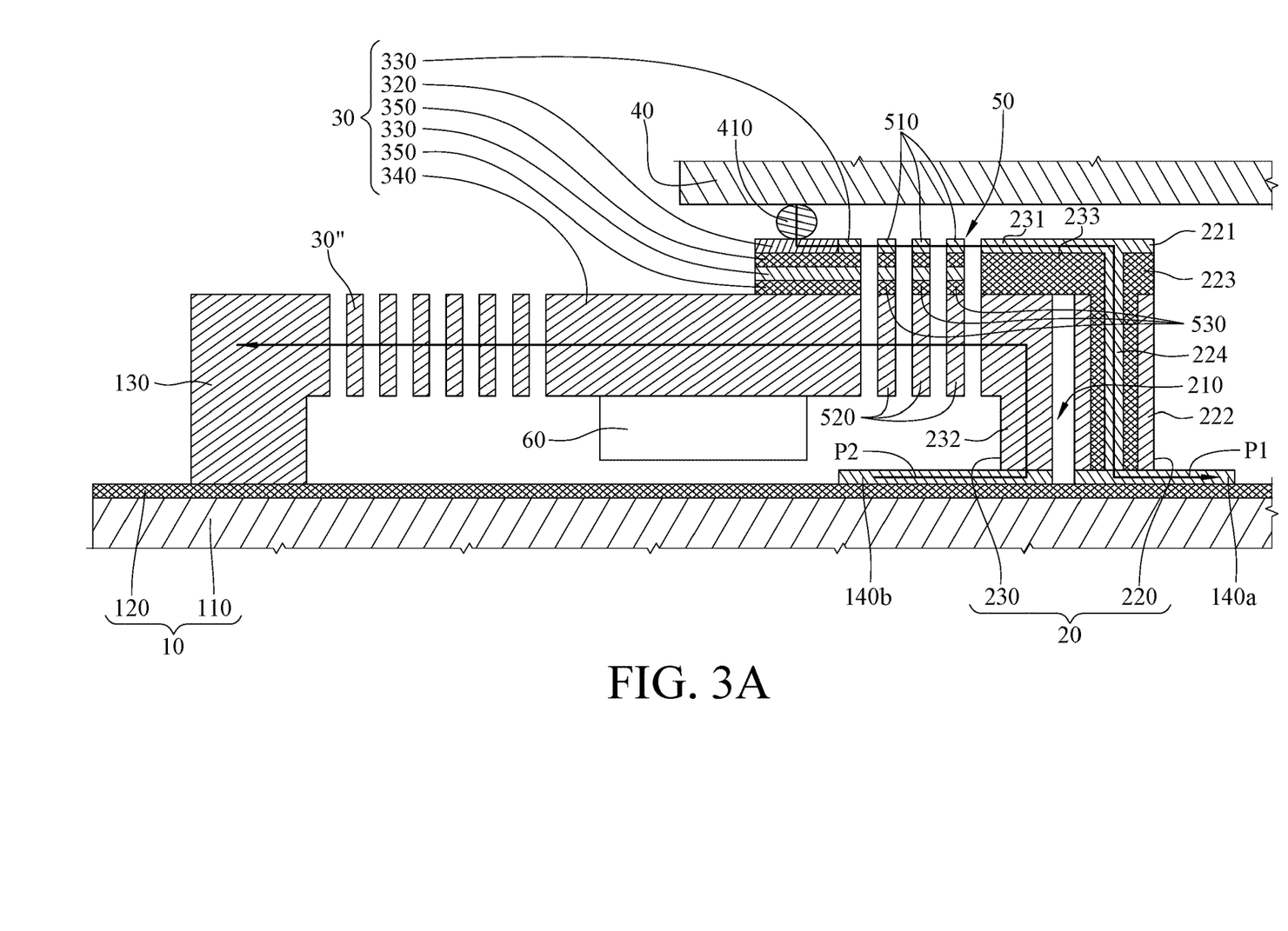
FIG. 3A and FIG. 3B are partially enlarged views of the MEMS device in FIG. 2.
Figure 3B:
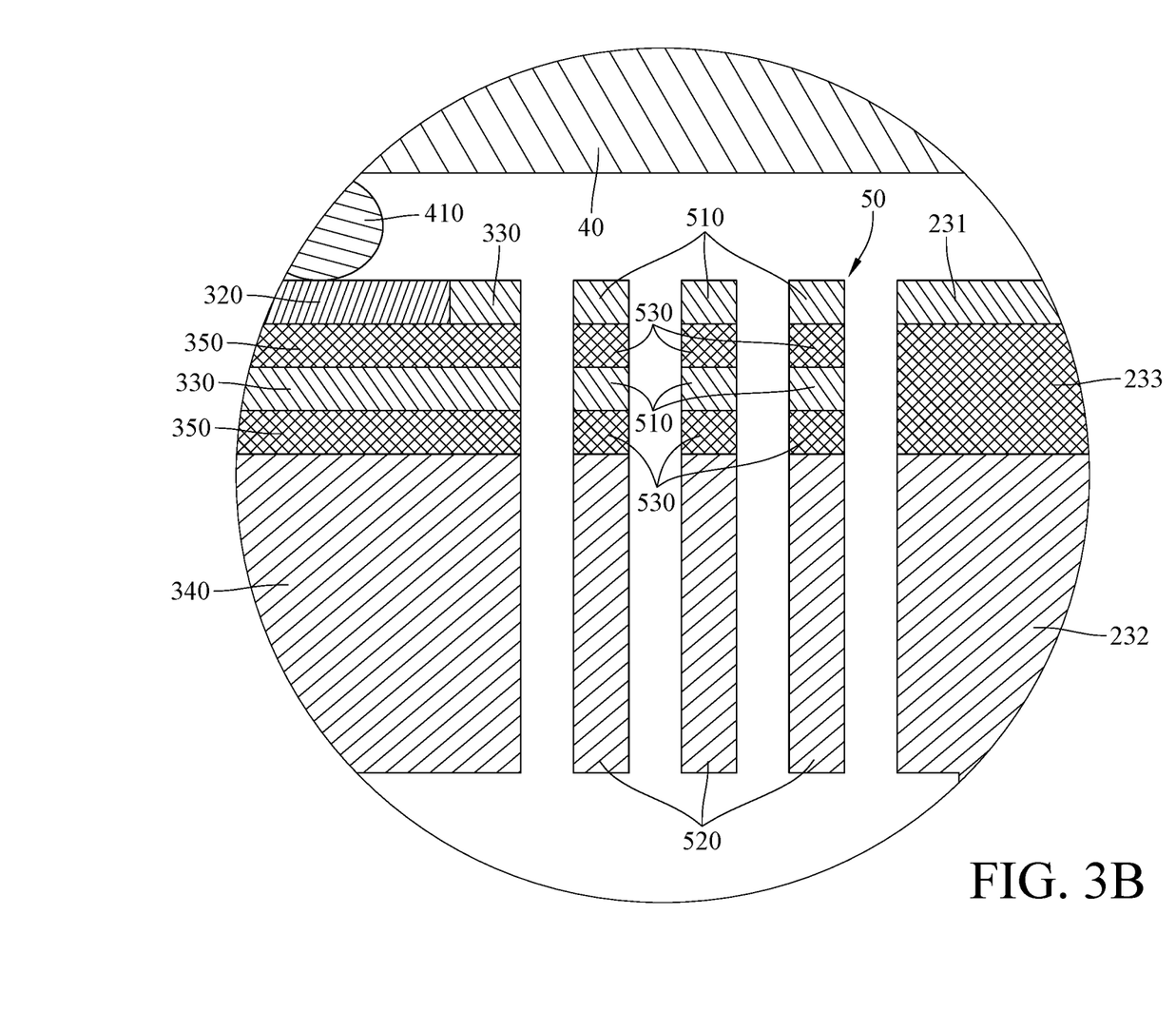
Figure 4A:
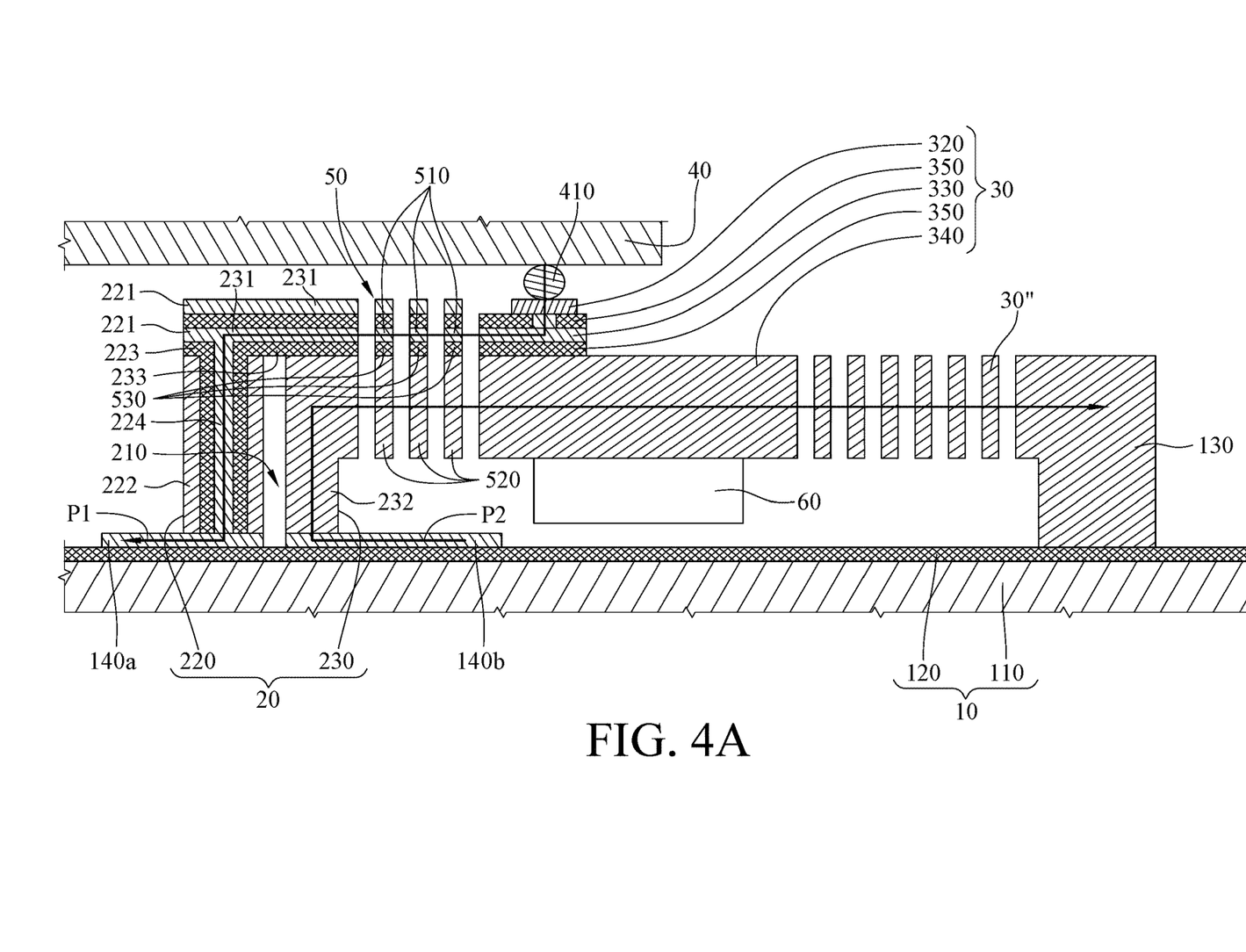
FIG. 4A and FIG. 4B are other partially enlarged views of the MEMS device in FIG. 2.
Figure 4B:
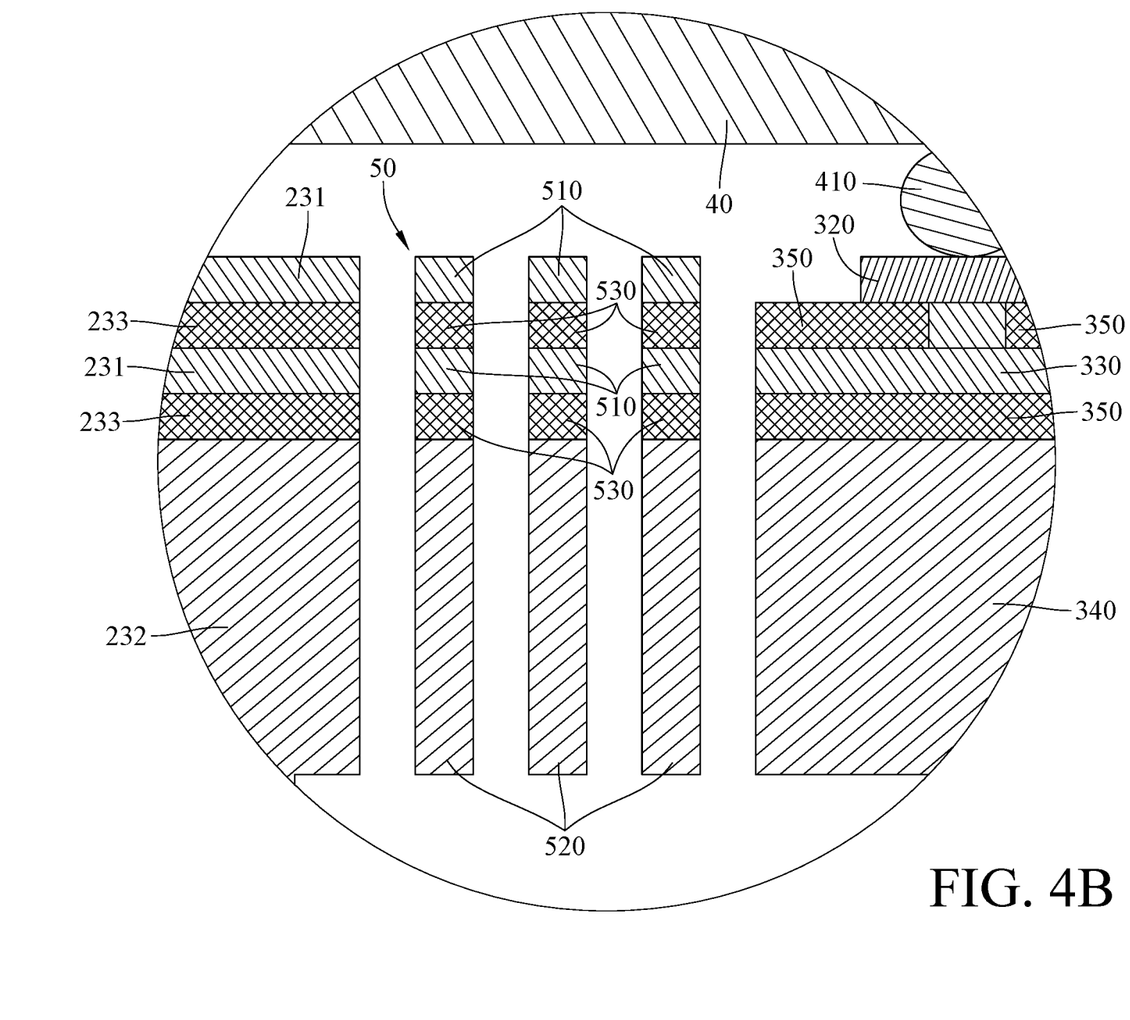

The elastic members 50 connect the anchors 20 with the stage 30. Please further refer to FIG. 3A through FIG. 4B. FIG. 3A and FIG. 3B are partially enlarged views of the MEMS device in FIG. 2. FIG. 4A and FIG. 4B are other partially enlarged views of the MEMS device in FIG. 2. Each of the elastic members 50 includes a plurality of first electrical channels 510, a second electrical channel 520 and a plurality of electrical insulation layers 530. The first electrical channel 510 is a metal layer, and the second electrical channel 520 is a semiconductor layer. The first electrical channel 510 is electrically connected with the electrical interconnection 410 of the sensing chip 40, and the second electrical channel 520 is electrically connected with the electrodes 310 of the stage 30. As shown in FIG. 3A and FIG. 3B, in one elastic member 50, the upper electrical insulation layer 530 is disposed between the upper first electrical channel 510 and the lower first electrical channel 510, such that the upper first electrical channel 510 is electrically insulated from the lower first electrical channel 510. The lower electrical insulation layer 530 is disposed between the lower first electrical channel 510 and the second electrical channel 520, such that the first electrical channels 510 are electrically insulated from the second electrical channel 520.

Different electrical interconnections 410 of the sensing chip 40 are electrically connected with the first electrical channels 510 of the elastic member 50 in different layers, respectively. Specifically, as shown in FIG. 3A and FIG. 3B, one of the electrical interconnections 410, which is close to the left side of the sensing chip 40, is electrically connected with the upper first electrical channel 510. As shown in FIG. 4A and FIG. 4B, one of the electrical interconnections 410, which is close to the right side of the sensing chip 40, is electrically connected with the lower first electrical channel 510. When the number of the electrical interconnections of the sensing chip 40 is larger r than that of the elastic members 50, a plurality of first electrical channels 510 in the elastic member 50 provide sufficient paths for transmitting electrical signals from the sensing chip to the anchor 20. It is worth noting that the protective scope of the present disclosure is not limited to the number of first electrical channels 510 shown in FIG. 3A through FIG. 4B. In one embodiment that the number of electrical interconnections of the sensing chip is less than that of the elastic members, each of the elastic members 50 includes one first electrical channel 510 and one electrical insulation layer 530, and the electrical interconnections 410 of the sensing chip 40 are electrically connected with the first electrical channels 510 in different elastic members 50.

The first electrical channel 510 is configured to transmit a first electrical signal, and the second electrical channel 520 is configured to transmit electric charges. In detail, a sensing signal (first electrical signal) generated by the sensing chip 40 is transmitted through the electrical interconnection 410, the conductive connecting layer 320 and the first electrical channel 510 of the elastic member 50. Furthermore, referring to FIG. 1, the electric charges accumulated on the electrode 310 of the stage 30 are transmitted to the electrode 310 through the second electrical channel 520 of the elastic member 50 so as to generate electrostatic force for driving the stage 30.

According to one embodiment of the present disclosure, the anchor includes a trench which divides the anchor into an inner anchor and an outer anchor. As shown in FIG. 2, a trench 210 of the anchor 20 divides the anchor 20 into an inner anchor 220 and an outer anchor 230, such that the inner anchor 220 and the outer anchor 230 are electrically insulated from each other. As shown in FIG. 3A, the first electrical channel 510 of the elastic member 50 is electrically connected with the inner anchor 220, and the second electrical channel 520 is electrically connected with the outer anchor 230. The sensing signal generated by the sensing chip 40 is the first electrical signal. The first electrical signal is transmitted to the conductive layer 140a of the substrate 10 through the electrical interconnection 410, the conductive connecting layer 320, the first electrical channel 510 and the inner anchor 220. Moreover, the electric charges, provided for making the electrode 310 generate electrostatic force, are input in the MEMS device 1 from outside, and then the electric charges are transmitted to the electrodes 310 through the conductive layer 140b of the substrate 10, the outer anchor 230, the second electrical channel 520 and the stage 30.

According to one embodiment of the present disclosure, the stage 30 includes at least one metal layer, a semiconductor layer, and an insulating layer. As shown in FIG. 3A and FIG. 4A, the stage 30 includes a plurality of metal layers 330, a semiconductor layer 340 and a plurality of insulating layers 350. The metal layer 330 is connected with the conductive connecting layer 320. One of the insulating layers 350 is disposed between the metal layer 330 and the semiconductor layer 340, such that the metal layer 330 is insulated from the semiconductor layer 340. Another one of the insulating layers 350 is disposed between two metal layers 330, such that the two metal layers 330 are insulated from each other. The first electrical channel 510 is connected with the metal layer 330 of the stage 30, and the second electrical channel 520 is connected with the semiconductor layer 340 of the stage 30. The electrical interconnection 410 of the sensing chip 40 is electrically connected with the first electrical channel 510 via the conductive connecting layer 320 and the metal layer 330. The electrode 310 of the stage 30 is electrically connected with the second electrical channel 520 via the semiconductor layer 340. It is worth noting that the protective scope of the present disclosure is not limited to the number of metal layers 330 and the number of insulating layers 350.

According to one embodiment of the present disclosure, the MEMS device 1 is an image capturing unit. In the MEMS device 1, the sensing chip 40 is an image sensor chip such as a complementary metal-oxide semiconductor (CMOS) or a charge-coupled device (CCD). In this embodiment, the first electrical signal generated by the sensing chip 40 is an image signal. Furthermore, the electrical interconnection 410 of the sensing chip 40 is a conductive bump or a conductive wire. For example, the electrical interconnection 410 can be a solder ball or a gold wire. Therefore, when the stage 30 is moving, there is no relative movement between the electrical interconnections 410 (the conductive bump or the conductive wire) and the stage 30 so as to prevent fracture of a conductive bump or a conductive wire due to pulling force and pushing force repeatedly applied on the electrical interconnection 410.

According to one embodiment of the present disclosure, the inner anchor includes at least one metal layer, a semiconductor layer, and an insulating layer. As shown in FIG. 3A, the inner anchor 220 includes a metal layer 221, a semiconductor layer 222 and an insulating layer 223. The semiconductor layer 222 of the inner anchor 220 is electrically connected with the conductive layer 140a of the substrate 10, and the insulating layer 223 is disposed between the metal layer 221 and the semiconductor layer 222, such that the metal layer 221 are electrically insulated from the semiconductor layer 222. The first electrical channel 510 of the elastic member 50 is connected with the metal layer 221 of the inner anchor 220. As shown in FIG. 4A, the inner anchor 220 includes a plurality of metal layers 221, a semiconductor layer 222 and an insulating layer 223. It is worth noting that the protective scope of the present disclosure is not limited to the number of metal layers 221.

According to one embodiment of the present disclosure, the outer anchor includes at least one metal layer, a semiconductor layer, and an insulating layer. As shown in FIG. 3A, the outer anchor 230 includes a metal layer 231, a semiconductor layer 232 and an insulating layer 233. The semiconductor layer 232 is electrically connected with the conductive layer 140b of the substrate 10. The insulating layer 233 is disposed between the metal layer 231 and the semiconductor layer 232, such that the metal layer 231 is electrically insulated from the semiconductor layer 232. The second electrical channel 520 of the elastic member 50 is connected with the semiconductor layer 232 of the outer anchor 230. As shown in FIG. 4A, the outer anchor 230 includes a plurality of metal layers 231, a semiconductor layer 232 and an insulating layer 233. It is worth noting that the protective scope of the present disclosure is not limited to the number of metal layers 231.

According to one embodiment of the present disclosure, the inner anchor further includes at least one conductive post. As shown in FIG. 3A, the inner anchor 220 includes a conductive post 224. The conductive post 224 extends through the insulating layer 223 of the inner anchor 220, and the conductive post 224 connects the metal layer 221 of the inner anchor 220 with the conductive layer 140a under the inner anchor 220. It is worth noting that the protective scope of the present disclosure is not limited to the number of conductive posts 224.

According to one embodiment of the present disclosure, the metal layers 221 and 231 of the anchor 20, the conductive connecting layer 320 of the stage 30, the metal layer 330 of the stage 30, and the first electrical channel 510 of the elastic member 50 can be made of the same metal material. The metal material, for example, but not limited to, is copper, nickel, tin or titanium. Furthermore, the bases 130 of the substrate 10, the semiconductor layers 222 and 232 of the anchor 20, the semiconductor layer 340 of the stage 30, the second electrical channel 520 of the elastic member 50 can be made of the same semiconductor material. The semiconductor material, for example, but not limited to, is doped silicon. In addition, the insulating layers 223 and 233 of the anchor 20, the insulating layer 350 of the stage 30, and the electrical insulation layer 530 of the elastic member 50 can be made of the same electrical insulation material. The insulation material, for example, but not limited to, is silicon oxide or silicon nitride.

According to one embodiment of the present disclosure, a plurality of stoppers are disposed on a bottom surface of the semiconductor layer of the movable stage. As shown in FIG. 2 and FIG. 3A, the MEMS device 1 further includes a plurality of stoppers 60 disposed on the bottom surface 360 of the semiconductor layer 340 of the stage 30. In a process (for example, a flip chip process or a wire bonding process) of bonding the electrical interconnection 410 of the sensing chip 40 with the conductive connecting layer 320 of the stage 30, when the sensing chip 40 is placed on the stage 30, the stoppers 60 press against the substrate 10 to provide a supporting force to the stage 30 for the prevention of an overly large displacement of the stage 30, thereby increasing yield of the flip chip process or yield of the wire bonding process.

According to one embodiment of the present disclosure, the stoppers are symmetrically arranged on the bottom surface of the semiconductor layer of the stage with respect to a center of a mass of the stage. A center C of mass of the stage 30 is shown in FIG. 1 and FIG. 2. The stopper 60 are symmetrically arranged on the bottom surface 360 of the semiconductor layer 340 of the stage 30 with respect to the center C of mass of the stage 30. In the process of bonding the electrical interconnection 410 of the sensing chip 40 with the conductive connecting layer 320 of the stage 30, when the stopper 60 press against the substrate 10, the arrangement of the stopper in a manner of point symmetry with respect to center C of mass of the stage is favorable for obtaining evenly distributed force for supporting the stage 30. Thus, an uneven downward displacement in different regions of the stage 30 is prevented.

Paths for transmitting the sensing signal (first electrical signal) and the electric charges configured to provide electrostatic force are depicted in FIG. 3A and FIG. 4A. As for an example in which the sensing chip 40 is an image sensor chip, the sensing chip 40 receives light to generate the image signal. The image signal is transmitted to the conductive layer 140a of the substrate 10 through a path P1 which consists of the electrical interconnection 410, the conductive connecting layer 320, the metal layer 330, the first electrical channel 510, the metal layer 231, the metal layer 221 and the conductive post 224. Furthermore, in a condition that the MEMS device 1 is applied to a camera when it is necessary to compensate for the camera displacement shift by the MEMS device 1, the electrode 310 of the stage 30 generates an electrostatic force to move the stage 30. The electric charges for generating electrostatic force can be input into the conductive layer 140b of the substrate 10 from the outside of the substrate 10 (for example, IC for a special purpose; ASIC). Then, the electric charges are transmitted to the electrode 310 of the stage 30 through a path P2 which consists of the semiconductor layer 232, the second electrical channel 520 and the semiconductor layer 340, thereby generating electrostatic force.

Figure 5:
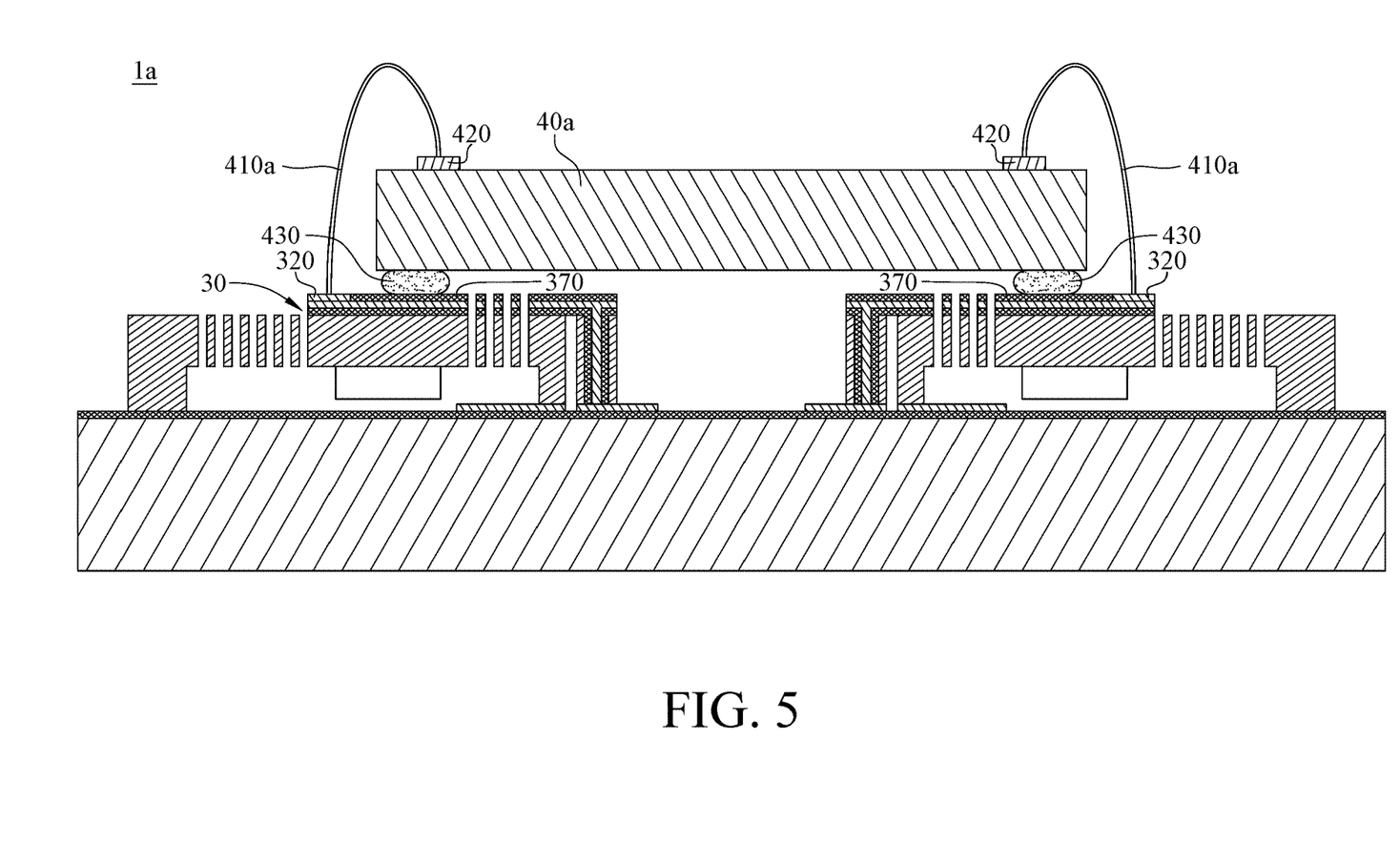
FIG. 5 is a cross-sectional view of a MEMS device with a movable stage according to a second embodiment of the present disclosure.

FIG. 5 is a cross-sectional view of a MEMS device with a movable stage according to a second embodiment of the present disclosure. Since the second embodiment is similar to the first embodiment, the differences therebetween are mainly described hereafter. In this embodiment, an electrical interconnection 410a of a sensing chip 40a in a MEMS device 1a is a metal wire. The electrical interconnection 410a connects a bonding pad 420 of the sensing chip 40a with the conductive connecting layer 320 of the stage 30 in wire bonding manner. Moreover, the sensing chip 40a further includes a plurality of adhesives 430, and the sensing chip 40a is bonded with an insulating layer 370 of the stage 30 by the adhesives 430.

Figure 6:
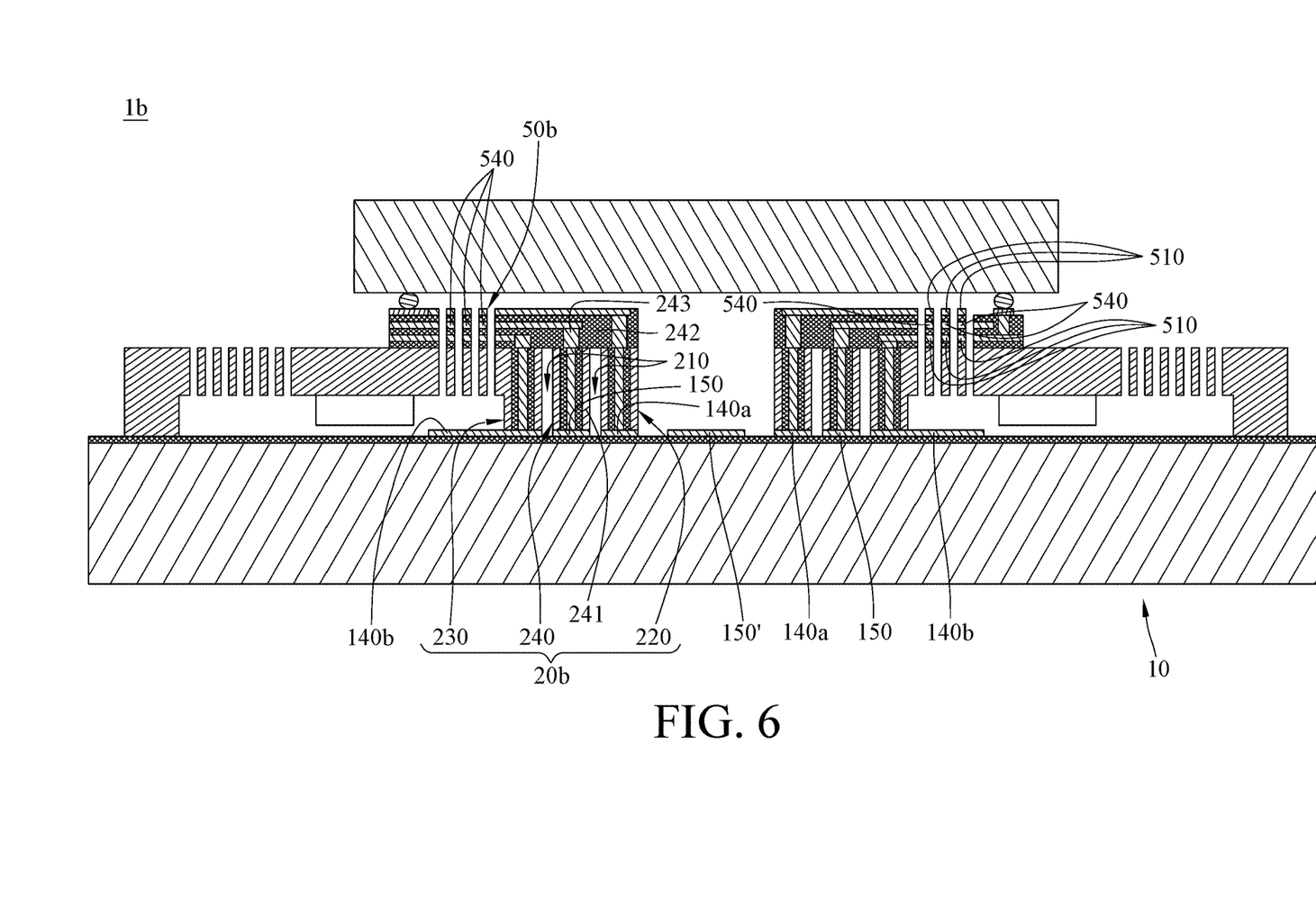
FIG. 6 is a cross-sectional view of a MEMS device with a movable stage according to a third embodiment of the present disclosure.
Figure 7:
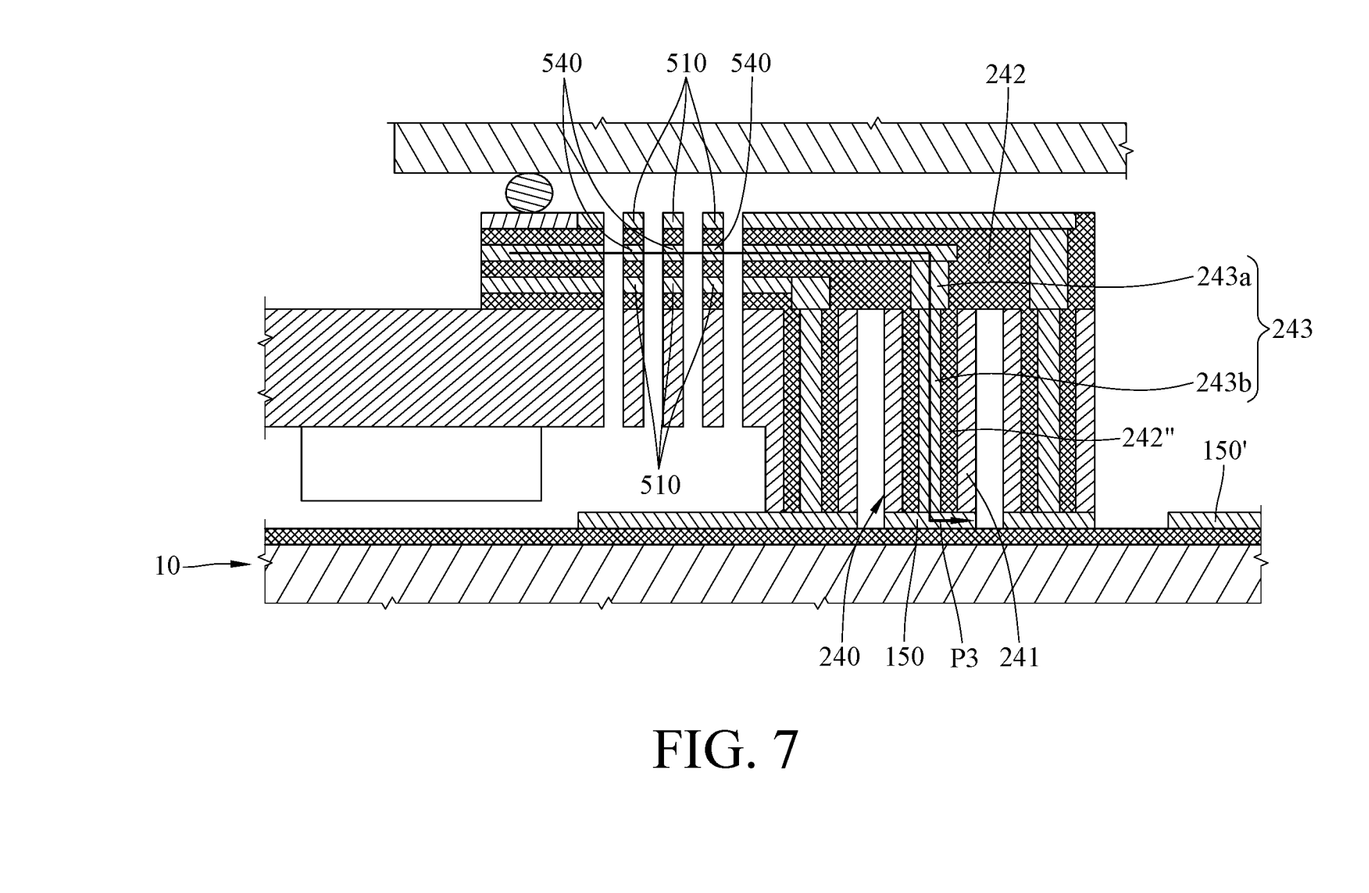
FIG. 7 is a partially enlarged view of the MEMS device in FIG. 6.

According to one embodiment of the present disclosure, the elastic member further includes a ground metal layer. Please refer to FIG. 6 and FIG. 7. FIG. 6 is a cross-sectional view of a MEMS device with a movable stage according to a third embodiment of the present disclosure. FIG. 7 is an enlarged view of the MEMS device in FIG. 6. Since the third embodiment is similar to the first embodiment, the differences therebetween are mainly described hereafter. In this embodiment, an anchor 20b of a MEMS device 1b further includes a middle anchor 240, and an elastic member 50b of the MEMS device 1b further includes a ground metal layer 540. In detail, two trenches 210 of the anchor 20b divide the anchor 20b into the inner anchor 220, a middle anchor 240 and the outer anchor 230. The inner anchor 220, the middle anchor 240 and the outer anchor 230 are electrically insulated from one another. The configurations of the inner anchor 220 and the outer anchor 230 can be referred to the aforementioned description corresponding to FIG. 3A and FIG. 4A.

The middle anchor 240 includes a semiconductor layer 241, an insulating layer 242, an insulating layer 242" and a conductive post 243. The ground metal layer 540 is disposed between the first electrical channels 510 of the elastic member 50*b*. The ground metal layer 540 and the first electrical channels 510 are electrically insulated from each other by the insulating layers of the elastic member 50*b*. The ground metal layer 540 is electrically connected with a ground metal panel 150' of the substrate 10 so as to achieve ground connection. Since the ground metal layer 540 is electrically connected with the ground metal panel 150' of the substrate 10, a crosstalk caused by the interference among the first electrical signals traveling in the first electrical channels 510 is prevented. The conductive post 243 includes a first conductive portion 243*a* and a second conductive portion 243*b*. The first conductive portion 243*a* extends through the insulating layer 242, and the second conductive portion 243*b* extends through the insulating layer 242".

As shown in FIG. 7, a ground path P3, through which the ground metal layer 540 is electrically connected with the ground metal panel 150' of the substrate 10, is: the ground metal layer 540 is connected with a conductive layer 150 of the substrate 10 via the conductive post 243; and the conductive layer 150 is electrically connected with the ground metal panel 150' which has a larger area than the conductive layer 150. Since the ground metal layer 540 is electrically connected with ground metal panel 150' having larger area, the ground metal layer 540 can provide better ground connection. It is worth noting that the protective scope of the present disclosure is not limited to the number of conductive posts 243.

Figure 8:
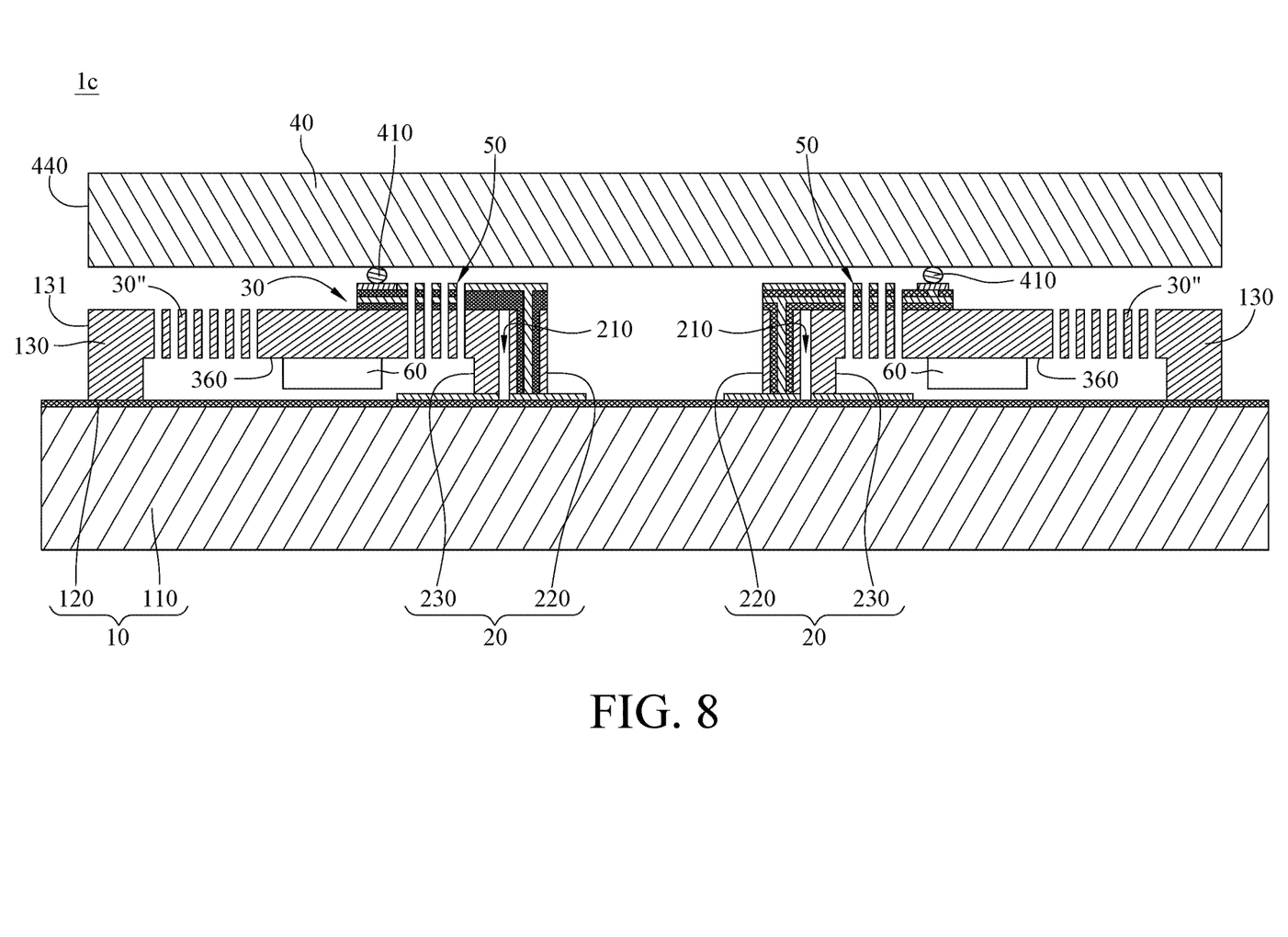
FIG. 8 is a cross-sectional view of a MEMS device with a movable stage according to a fourth embodiment of the present disclosure.

FIG. 8 is a cross-sectional view of a MEMS device with a movable stage according to a fourth embodiment of the present disclosure. Since the fourth embodiment is similar to the first embodiment, the differences therebetween are mainly described hereafter. In this embodiment, the edge 440 of the sensing chip 40 is substantially aligned with the outer edge 131 of the base 130 of the substrate 10, such that overall area of the MEMS device can be reduced. Thus, in a semiconductor process, more MEMS devices with movable stage can be manufactured on a single wafer.

According to the MEMS device with movable stage disclosed in the present disclosure, the electrical interconnection of the sensing chip is connected with the conductive connecting layer of the movable stage. Also, the first electrical channel of the elastic member is electrically connected with the electrical interconnection, and the second electrical channel of the elastic member is electrically connected with the electrode of the movable stage. The first electrical channel is configured to transmit sensing signal generated by the sensing chip, and the second electrical channel is configured to transmit the electric charges for generating electrostatic force at the electrode. Therefore, when the stage is moving, there is no relative movement between the electrical interconnection and the stage, such that it is favorable for reducing the blurring of images as well as preventing fracture of the electrical interconnections due to the pulling and pushing force repeatedly applied on the electrical interconnection.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A MEMS (Microelectromechanical system) device with movable stage, comprising:
    a substrate;
    at least one anchor disposed on the substrate;
    a stage, comprising:
        at least one electrode; and
        at least one conductive connecting layer;
    a sensing chip disposed on the stage, the sensing chip comprising at least one electrical interconnection connected with the at least one conductive connecting layer of the stage; and
    at least one elastic member connected with the stage and the at least one anchor, the at least one elastic member comprising:
        at least one first electrical channel configured to transmit a first electrical signal generated by the sensing chip;
        a second electrical channel; and
        an electrical insulation layer disposed between the at least one first electrical channel and the second electrical channel, the electrical insulation layer is below the at least one first electrical channel and above the second electrical channel;
    wherein the at least one first electrical channel is electrically connected with the at least one electrical interconnection, the second electrical channel is electrically connected with the at least one electrode, and the electrical insulation layer of the at least one elastic member is physically connected with at least one insulating layer of the at least one anchor.

2. The MEMS device with movable stage according to claim 1, wherein the substrate comprises a ground metal panel, the at least one elastic member further comprises a ground metal layer connected with the ground metal panel, the at least one first electrical channel comprises a plurality of first electrical channels, the ground metal layer is disposed between each of the plurality of first electrical channels, and each of the plurality of first electrical channels is electrically insulated from the ground metal layer.

3. The MEMS device with movable stage according to claim 1, wherein the at least one electrical interconnection is at least one conductive bump.

4. The MEMS device with movable stage according to claim 1, wherein the at least one electrical interconnection is at least one conductive wire.

5. The MEMS device with movable stage according to claim 1, wherein the sensing chip is an image sensor chip, and the first electrical signal is an image signal.

6. The MEMS device with movable stage according to claim 1, wherein the second electrical channel is configured to transmit an electric charge.

7. The MEMS device with movable stage according to claim 1, wherein the at least one anchor further comprises a trench dividing the at least one anchor into an inner anchor and an outer anchor such that the inner anchor and the outer anchor are electrically insulated from each other, the at least one insulating layer comprises an insulating layer of the inner anchor and an insulating layer of the outer anchor, the at least one first electrical channel is electrically connected with the inner anchor, and the second electrical channel is electrically connected with the outer anchor.

8. The MEMS device with movable stage according to claim 7, wherein the at least one first electrical channel is at least one metal layer, and the second electrical channel is a semiconductor layer.

9. The MEMS device with movable stage according to claim 8, wherein the inner anchor comprises at least one metal layer, a semiconductor layer, and the insulating layer, the insulating layer of the inner anchor is disposed between the at least one metal layer and the semiconductor layer of the inner anchor, and the at least one first electrical channel is connected with the at least one metal layer of the inner anchor.

10. The MEMS device with movable stage according to claim 8, wherein the outer anchor comprises at least one metal layer, a semiconductor layer, and the insulating layer, the insulating layer of the outer anchor is disposed between the at least one metal layer and the semiconductor layer of the outer anchor, and the second electrical channel is connected with the semiconductor layer of the outer anchor.

11. The MEMS device with movable stage according to claim 9, wherein the inner anchor further comprises at least one conductive post extending through the insulating layer of the inner anchor, and the at least one conductive post is connected with the at least one metal layer of the inner anchor and the semiconductor layer of the inner anchor.

12. The MEMS device with movable stage according to claim 8, wherein the stage further comprises at least one metal layer, a semiconductor layer, and an insulating layer, the insulating layer of the stage is disposed between the at least one metal layer and the semiconductor layer of the stage, the at least one first electrical channel is connected with the at least one metal layer of the stage, and the second electrical channel is connected with the semiconductor layer of the stage.

13. The MEMS device with movable stage according to claim 12, wherein the at least one metal layer of the stage is connected with the at least one conductive connecting layer.

14. The MEMS device with movable stage according to claim 12, wherein the stage further comprises a plurality of stoppers disposed on a bottom surface of the semiconductor layer of the stage.

15. The MEMS device with movable stage according to claim 14, wherein the plurality of stoppers are symmetrically arranged on the bottom surface with respect to a center of a mass of the semiconductor layer of the stage.

16. The MEMS device with movable stage according to claim 1, wherein the substrate includes a plurality of bases, the stage is connected with the plurality of bases, and an edge of the sensing chip is substantially aligned with an outer edge of each of the plurality of bases.

* * * * *